(12) United States Patent
Xing

(10) Patent No.: US 10,429,418 B2
(45) Date of Patent: Oct. 1, 2019

(54) FREQUENCY MEASUREMENT DEVICE, FREQUENCY MEASUREMENT METHOD AND UNDER FREQUENCY LOAD SHEDDING DEVICE

(71) Applicant: Schneider Electric Industries SAS, Rueil-Malmaison (FR)

(72) Inventor: Jinlei Xing, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 357 days.

(21) Appl. No.: 15/434,281

(22) Filed: Feb. 16, 2017

(65) Prior Publication Data

US 2017/0254840 A1    Sep. 7, 2017

(30) Foreign Application Priority Data

Mar. 7, 2016    (CN) .......................... 2016 1 0127182

(51) Int. Cl.
| | |
|---|---|
| *G01R 23/00* | (2006.01) |
| *G01R 25/00* | (2006.01) |
| *G01R 23/12* | (2006.01) |
| *G01R 19/25* | (2006.01) |

(52) U.S. Cl.
CPC ......... *G01R 23/12* (2013.01); *G01R 19/2513* (2013.01); *G01R 23/00* (2013.01)

(58) Field of Classification Search
CPC ........ G01R 23/12; G01R 23/00; G01R 23/02; G01R 23/16; G01R 25/00; H04B 2201/70727; H04B 2201/70728; H04B 2201/7073

See application file for complete search history.

(56) References Cited

U.S. PATENT DOCUMENTS

| | | |
|---|---|---|
| 4,319,329 A | 3/1982 | Girgis et al. |
| 5,721,689 A | 2/1998 | Hart et al. |

OTHER PUBLICATIONS

Extended European Search Report for EP Application No. 16306726.7, dated Aug. 21, 2017, 6 pages.
Belega, Daniel, et al., "Accuracy Analysis of the Multicycle Synchrophasor Estimator Provided by the Interpolated DFT Algorithm", IEEE Transactions on Instruments and Measurement, vol. 62, No. 5, May 2013, 12 pages.

*Primary Examiner* — Son T Le
(74) *Attorney, Agent, or Firm* — Locke Lord LLP

(57) ABSTRACT

A frequency measurement device includes a sampling unit that outputs a voltage sampling value in accordance with a voltage to be sampled and a sampling frequency; an single-cycle DFT angle shift computation unit that computes and outputs a first angle shift in accordance with the voltage sampling value; an multi-cycle DFT angle shift computation unit that computes and outputs a second angle shift in accordance with the voltage sampling value; a selection unit that selects and outputs one of the first and second angle shifts as a selected angle offset; a sampling frequency computation and outputting unit that computes a sampling frequency in accordance with the selected angle offset and outputs the same to the sampling module unit as a new sampling frequency; and a frequency measurement value computation and outputting unit that computes and outputs a frequency measurement value in accordance with the selected angle offset.

12 Claims, 6 Drawing Sheets

S60

FREQUENCY MEASUREMENT DEVICE, FREQUENCY MEASUREMENT METHOD AND UNDER FREQUENCY LOAD SHEDDING DEVICE

TECHNICAL FIELD

Embodiments of the present disclosure relate to a frequency measurement device, a frequency measurement method and a under frequency load shedding device, and particularly to a frequency measurement device, a frequency measurement method and a under frequency load shedding device which compute angle offset by using both an angle shift computation unit based on single-cycle Discrete Fourier Transform (DFT) and an angle shift computation unit based on multi-cycle DFT.

BACKGROUND

Automatic devices of a power system, e.g. a relay protection device and a stability control device, need to measure a frequency of the power system accurately. An accuracy and speed of the frequency measurement is critical to reliability of the automatic device such as a under frequency load shedding device. In the past, the automatic device issues false action demands sometimes because the frequency measurement is not accurate, which results in unnecessary economic loss.

Conventional frequency measurement technologies mainly include a zero-crossing detection technique and a phase lock technique based on Discrete Fourier Transform (DFT). The accuracy of the zero-crossing technique is readily affected by transient process of the power system such as noises, harmonic waves and so on.

FIG. 1 is a circuit diagram of a frequency measurement device in prior art.

From FIG. 1, it can be known that this technique adopts the phase lock technique based on Discrete Fourier Transform DFT in the frequency measurement, which can filter noises and integral harmonic wave interference in some degree, but such a method adopts the single cycle DFT, which can not filter non-integral harmonic waves (e.g. fractional frequency harmonic interference), drastic change of voltage amplitudes and abrupt change of phase angles effectively. Although a filtering function of some degree can be achieved by using multi-cycle DFT simply, thereby reducing disturbance amplitudes, an overall lasting time of the disturbance is longer than that of the single-cycle DFT instead. Thus, a reliability of the frequency measurement can not be improved efficiently.

Furthermore, it can be known from FIG. 1 that a same control factor G is used in a sampling frequency operation and in a frequency measurement in a discrete phase lock loop for tracking frequencies. The control factor G, such as a proportion control factor for stabilizing time and overshoot, is used to adjust response characteristics. If the control factor G is equal to 1, a frequency stability error will be decreased, but a frequency response will be changed dramatically. If the control factor G is less than 1, i.e. under compensation, the frequency stability error will be increased, but the frequency response will be smooth. Because a sampling frequency and the frequency measurement will be both affected by the same control factor, it is difficult to satisfy both the accuracy of the frequency measurement and the smooth frequency response of the sampling frequency at the same time.

Therefore, in the past, when disturbance occurs in the power system, resulting that voltage amplitudes are fluctuated and phase angles are abruptly changed, or when there is fractional frequency harmonic interference, the frequency measurement value is always not accurate.

Therefore, there is need to develop a new frequency measurement technique which can improve the accuracy of the frequency measurement as much as possible in a case where disturbance occurs in the power system while the requirement for the frequency response speed is satisfied.

SUMMARY

The embodiments of the disclosure is made in light of above problems, the purpose of which is to provide a frequency measurement device, a frequency measurement method and an under frequency load shedding device which can improve the accuracy of the frequency measurement as possible in a case where disturbance occurs in the power system while the requirement for the frequency response speed is satisfied.

A frequency measurement device of an embodiment of the disclosure comprises:

a sampling module unit that outputs a voltage sampling value in accordance with a voltage to be sampled and a sampling frequency input thereto;

an angle shift computation unit based on single-cycle Discrete Fourier Transform DFT that computes and outputs a first angle shift based on the single-cycle DFT, in accordance with the voltage sampling value input from the sampling module unit;

an angle shift computation unit based on multi-cycle DFT that computes and outputs a second angle shift based on the multi-cycle DFT, in accordance with the voltage sampling value input from the sampling module unit;

an angle shift selection unit that selects and outputs one of the first angle shift and second angle shift a absolute value of which is smaller as a selected angle offset, in accordance with the first angle shift and second angle shift input thereto;

a sampling frequency computation and outputting unit that computes a sampling frequency in accordance with the selected angle offset input thereto, and outputs the sampling frequency to the sampling module unit as a new sampling frequency; and a frequency measurement value computation and outputting unit that computes and outputs a frequency measurement value in accordance with the selected angle offset input thereto.

A frequency measurement method of an embodiment of the disclosure comprises:

a sampling step of inputting a voltage to be sampled and a sampling frequency to a sampling module and outputting a voltage sampling value;

an angle shift computing step based on single-cycle Discrete Fourier Transform DFT of computing and outputting a first angle shift based on the single-cycle DFT, in accordance with the voltage sampling value input from the sampling step;

an angle shift computing step based on multi-cycle DFT of computing and outputting a second angle shift based on the multi-cycle DFT, in accordance with the voltage sampling value input from the sampling step;

an angle shift selecting step of selecting and outputting one of the first angle shift and the second angle shift a absolute value of which is smaller as a selected angle offset, in accordance with the first and second angle shifts;

a sampling frequency computing and outputting step of computing a new sampling frequency in accordance with the selected angle offset inputted, and outputting the sampling frequency to the sampling module as a new sampling frequency; and a frequency measurement value computing and outputting step of computing and outputting a frequency measurement value in accordance with the selected angle offset inputted.

The technical solutions of the embodiments of the disclosure improve the frequency measurement technique based on DFT. It takes advantages of a manner of combining single-cycle DFT and multi-cycle DFT so as to compute frequency shift values by single-cycle DFT and multi-cycle DFT respectively at the same time and select one of the frequency shift values a absolute value of which is smaller as a basis for computing the frequency shift. In addition, it also adopts an "under compensation" manner to adjust the sampling frequency.

The technical solutions of the embodiments of the disclosure take advantages of filtering function of multi-cycle DFT and accelerate the frequency response process, thereby effectively improving the accuracy and the speed of the frequency measurement in a case of voltage disturbances. Therefore, the embodiments of the disclosure can facilitate increasing the reliability of the power automatic device, e.g. the under frequency load shedding device and reducing a probability of false action occurred.

BRIEF DESCRIPTION OF THE DRAWINGS

Other advantages and features will be more obvious and clear from the description below of embodiments of the present disclosure which are only for non-restrictive purpose in connection with the figures wherein like reference numerals represent like components or units, and wherein.

DETAILED DESCRIPTION

Embodiments of the present disclosure will be described in detail with reference to the figures. Although a plurality of particular embodiments of the present disclosure are illustrated in the figures, it should be understood that the disclosure can be implemented in various manners and should not be restricted by the embodiments set forth herein. Instead, these embodiments are provided so that the disclosure can be understood more thoroughly and completely and the scope of the disclosure can be completely conveyed to the skilled in arts.

Figure 2:
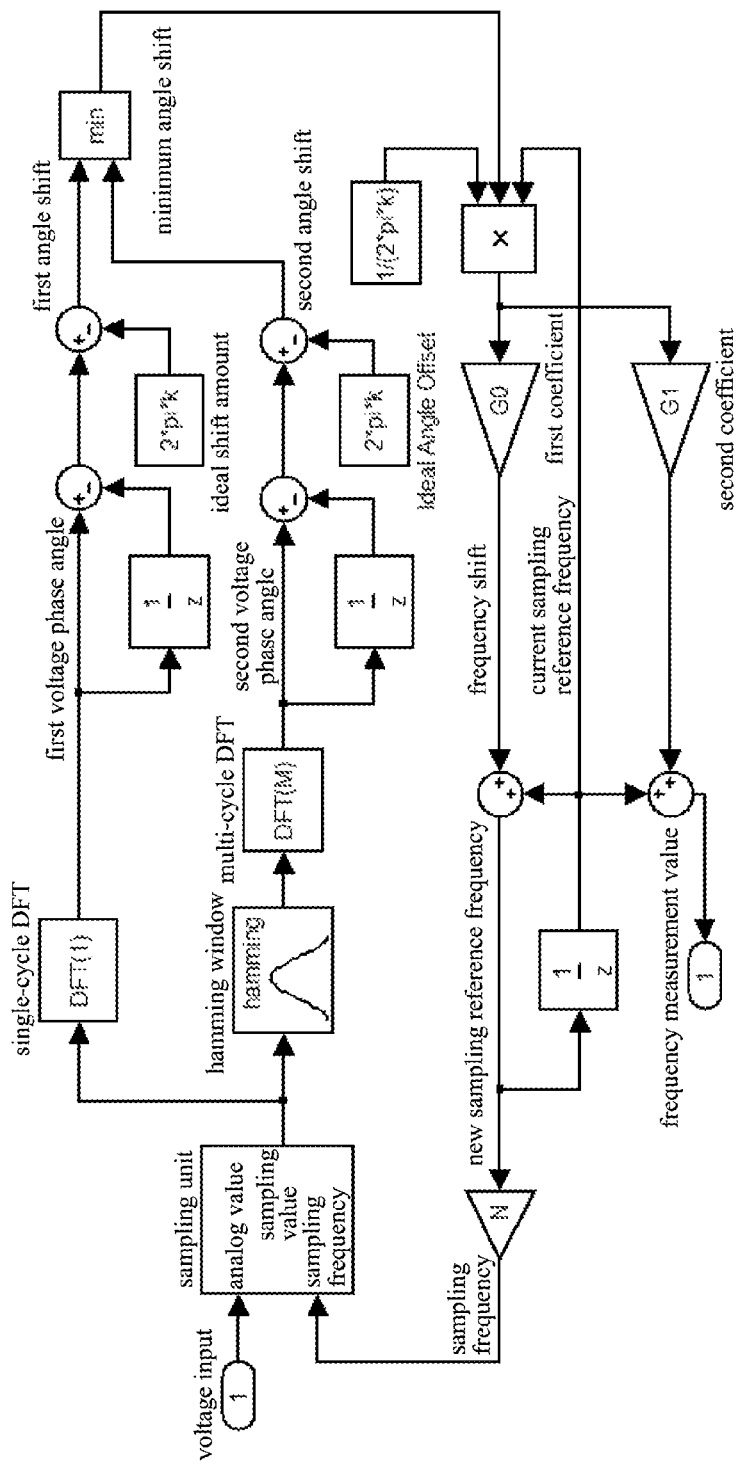
FIG. 2 is a circuit diagram of a frequency measurement device according to an embodiment of the disclosure.

FIG. 2 shows an example of a circuit diagram of a frequency measurement device of an embodiment of the present disclosure.

Figure 1:
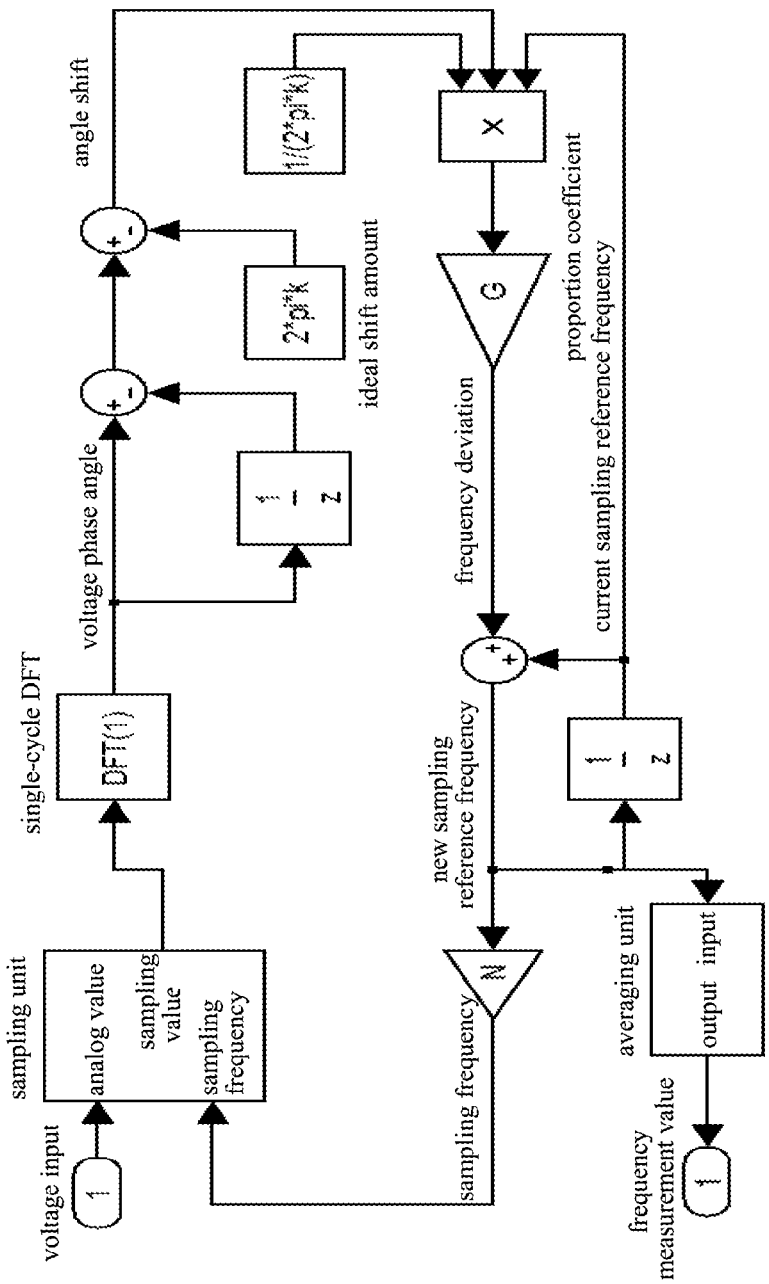
FIG. 1 is a circuit diagram of a frequency measurement device of prior art.

Compared with the circuit diagram of FIG. 1 in the prior art, it can be seen that the frequency measurement device of an embodiment of the disclosure computes angle shift values concurrently through single-cycle DFT and multi-cycle DFT, respectively, and selects one of the angle shift values a absolute value of which is smaller as a basis for computing the frequency shift. In a discrete phase lock loop, a proportion coefficient for a control factor used in the computing of the frequency measurement value is 1, and the proportion coefficient for the control factor used in the computing of a new sampling frequency is less than 1, that is, an "under-compensation" manner is employed to adjust the sampling frequency.

Figure 3:
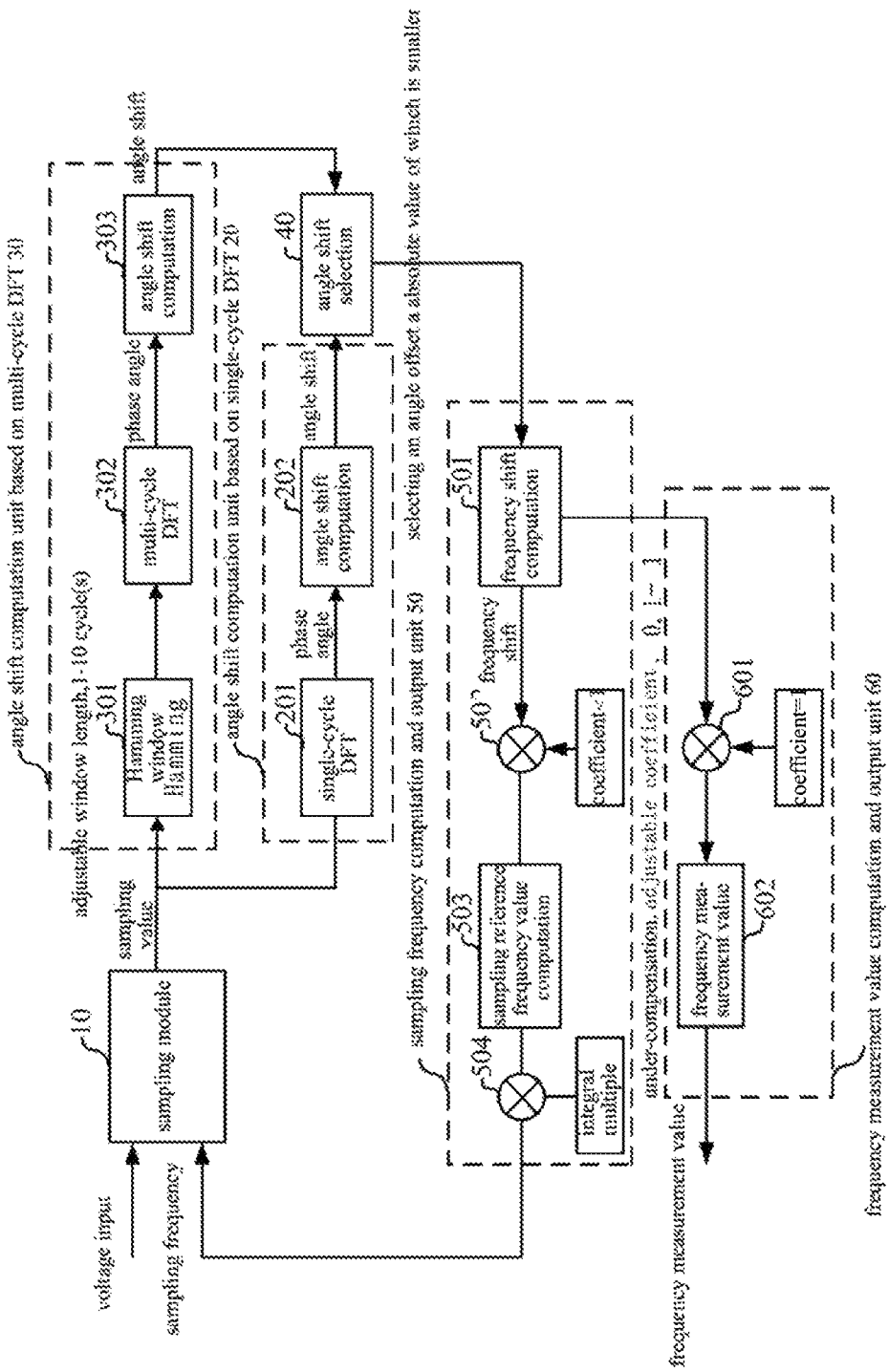
FIG. 3 is a block diagram of a specific structure of the frequency measurement device according to an embodiment of the disclosure.

FIG. 3 is a block diagram of a specific structure of the frequency measurement device of an embodiment of the present disclosure.

As is shown in FIG. 3, the frequency measurement device 1 of the embodiment of the disclosure comprises: a sampling module unit 10 that outputs a voltage sampling value in accordance with a voltage to be sampled and a sampling frequency input thereto; an angle shift computation unit 20 based on single-cycle Discrete Fourier Transform DFT that computes and outputs a first angle shift based on the single-cycle DFT, in accordance with the voltage sampling value input from the sampling module unit 10; an angle shift computation unit 30 based on multi-cycle DFT that computes and outputs a second angle shift based on the multi-cycles DFT, in accordance with the voltage sampling value input from the sampling module unit 10; an angle shift selection unit 40 that selects and outputs one of the first and second angle shifts a absolute value of which is smaller, as a selected angle offset, in accordance with the first and the second angle shifts input thereto; a sampling frequency computation and output unit 50 that computes a sampling frequency in accordance with the selected angle offset input thereto, and outputs the sampling frequency to the sampling module unit as a new sampling frequency; and a frequency measurement value computation and outputting unit 60 that computes and outputs a frequency measurement value in accordance with the selected angle offset input thereto.

The angle shift computation unit 20 based on single-cycle DFT comprises a single-cycle DFT unit 201 which performs DFT process on the input single-cycle voltage sampling value and outputs a first voltage phase angle; and a first angle shift computation unit 202 which computes and outputs the first angle shift in accordance with the first voltage phase angle.

The angle shift computation unit 30 based on multi-cycle DFT comprises a window unit 301 which intercepts and outputs the voltage sampling values of multiple cycles through a window function; a multi-cycle DFT unit 302 which performs DFT process on the inputted voltage sampling values of the multiple cycles, and computes and outputs a second voltage phase angle; and a second angle shift computation unit 303 which computes and outputs the second angle shift in accordance with the second voltage phase angle.

A hamming window function is preferably used as the window function described above, but it is not limited thereto. Other appropriate window functions can also be adopted.

The number of the multiple cycles described above is preferably from one to ten, but it is not limited thereto. Other appropriate number of cycles can also be adopted.

The frequency measurement device of the embodiment of the disclosure computes frequency shifts concurrently through single-cycle DFT and multi-cycle DFT, respectively, and selects one of the angle shifts a absolute value of which is smaller as a basis for computing the frequency shift, and thus it overcomes the defect that non-integral harmonic waves (e.g. fractional frequency harmonic interference), drastic change of voltage amplitudes and abrupt change of phase angles can not be filtered effectively when only the single cycle DFT is adopted to compute angle shift values, and the defect that a overall lasting time of the disturbance when only the multi-cycle DFT is adopted is instead longer than that of the single-cycle DFT such that the reliability of the frequency measurement can not be improved effectively. The advantages include a strong resistance to interferences and a short disturbance time.

The sampling frequency computation and outputting unit 50 of the embodiment of the present disclosure includes a frequency shift computation unit 501; a first multiplier 502; a sampling reference frequency value computation unit 503; and a second multiplier 504.

The frequency shift computation unit 501 computes and outputs a frequency shift in accordance with the selected angle offset inputted. The first multiplier 502 multiplies the frequency shift by a first coefficient, and then outputs a first result to the sampling reference frequency value computation unit 503. The sampling reference frequency value computation unit 503 computes and outputs a sampling reference frequency value in accordance with the input first result. The second multiplier 504 multiplies the sampling reference frequency value by an integer, generates a new sampling frequency, and outputs it to the sampling module for adjusting the sampling frequency. The operation as described above is one iteration process, and after the sampling frequency is adjusted, a next iteration operation is waited to begin. Operation intervals can be set based on specific applications. For example, the iteration operation is performed once every 10 ms or 20 ms.

The first coefficient is adjustable and is of a value larger than 0 and less than 1, preferably larger than 0.1 and less than 1.

Different from a conventional DFT frequency measurement solution, the embodiment of the present disclosure treats the frequency measurement value and the sampling reference frequency distinctively. The sampling frequency is of integral times of the sampling reference frequency. For example, the sampling reference frequency is 50 Hz and the sampling frequency is 2400 Hz. That is, when a signal is at the reference frequency, 48 sampling points are obtained during one period. Furthermore, in computing the new sampling reference frequency as described above, the proportion coefficient of the control factor is less than 1, that is, the sampling frequency is adjusted in an "under-compensation" manner. In this manner, not only a computation accuracy of the frequency measurement value is guaranteed, but also a better frequency response characteristic is obtained, thereby accelerating the frequency response.

The frequency measurement value computation and outputting unit 60 includes a third multiplier 601 and a frequency measurement value computation unit 602.

The third multiplier 601 multiplies the frequency shift by a second coefficient, and outputs a second result to the frequency measurement value computation unit 602. The frequency measurement value computation unit 602 computes and outputs the frequency measurement value in accordance with the second result. The second coefficient is preferably a value of 1.

In summary, the embodiments of the disclosure have at least one of the following features:

(1) Different from a conventional DFT frequency measurement solution, the embodiments of the present disclosure treat the frequency measurement value and the sampling reference frequency distinctively. The proportion coefficient of 1 is used in computing the frequency measurement value, and the proportion coefficient which is less than 1 is used in computing the new sampling reference frequency. That is, the sampling frequency is adjusted in the "under-compensation" manner. In this manner, not only a computation accuracy of the frequency measurement value is guaranteed, but also a better frequency response characteristic is obtained, thereby accelerating the frequency response.

(2) The single-cycle DFT and the multi-cycle DFT operate at the same time. The angle shift values are computed concurrently through the single-cycle DFT and the multi-cycle DFT, respectively, and one of the angle shift values an absolute value of which is smaller is selected.

The technical solution of the embodiments of the present disclosure as a whole has a better accuracy and reliability in the frequency measurement while the response speed can satisfy application requirements by combining the above features (1) and (2).

A frequency measurement method of the embodiments of the disclosure will be explained below with reference to the accompanying figures.

Figure 4:
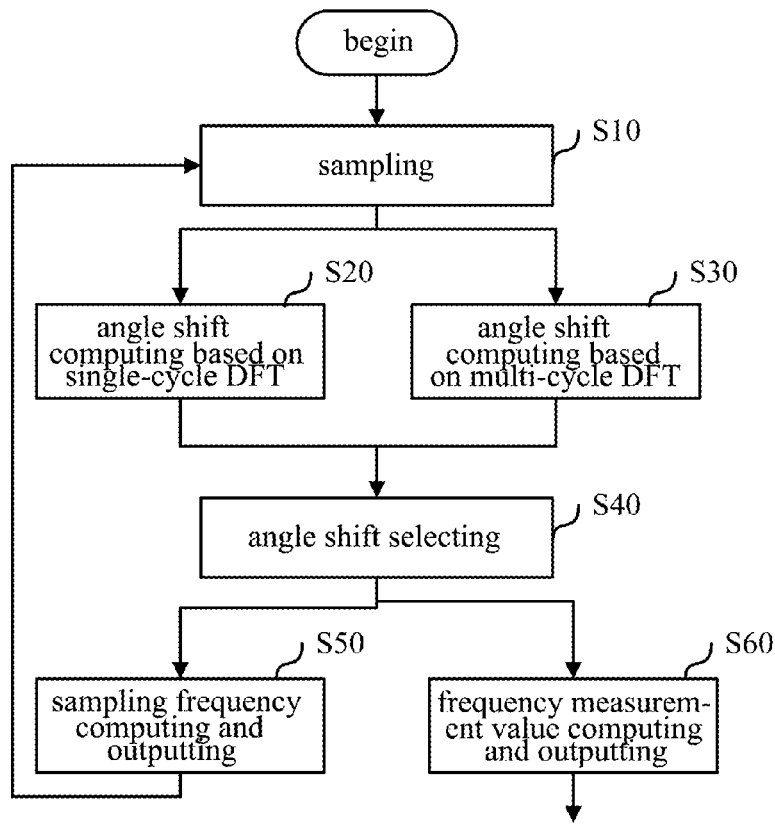
FIG. 4 is a flow chart of a frequency measurement method according to the disclosure.

FIG. 4 is a flow chart of the frequency measurement method according to an embodiment of the disclosure. As is shown in FIG. 4, the frequency measurement method of the embodiment of the disclosure comprises: a sampling step S10 of inputting a voltage to be sampled and a sampling frequency to a sampling module and outputting a voltage sampling value; an angle shift computing step S20 based on single-cycle Discrete Fourier Transform DFT of computing and outputting a first angle shift based on the single-cycle DFT, in accordance with the voltage sampling value input from the sampling step; an angle shift computing step S30 based on multi-cycle DFT of computing and outputting a second angle shift based on the multi-cycle DFT, in accordance with the voltage sampling value input from the sampling step; an angle shift selecting step S40 of inputting the first and second angle shifts, and selecting and outputting one of the first and the second angle shifts a absolute value of which is smaller as a selected angle offset; a sampling frequency computing and outputting step S50 of inputting the selected angle offset, computing a sampling frequency in accordance with the selected angle offset inputted, and outputting it to the sampling module as a new sampling frequency; and a frequency measurement value computing and outputting step S60 of inputting the selected angle offset, and computing and outputting a frequency measurement value in accordance with the selected angle offset inputted.

Figure 5:
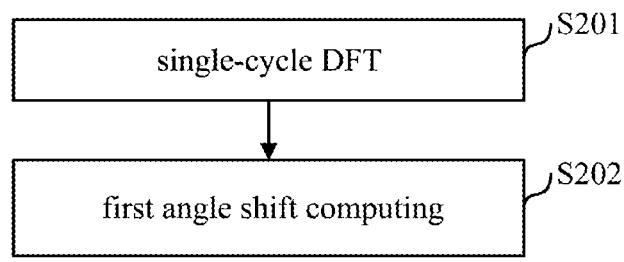
FIG. 5 is a flow chart of an angle shift computing step S20 based on single-cycle DFT in the frequency measurement method according to an embodiment of the disclosure.

FIG. 5 is a flow chart of the angle shift computing step S20 based on the single-cycle DFT in the frequency measurement method according to an embodiment of the disclosure.

The angle shift computing step S20 based on the single-cycle DFT particularly includes a single-cycle DFT step S201 of performing DFT process on the inputted voltage sampling value of single-cycle and outputting a first voltage phase angle; and a first angle shift computing step S202 of computing and outputting a first angle offset as the first angle shift, in accordance with the first voltage angle phase.

Figure 6:
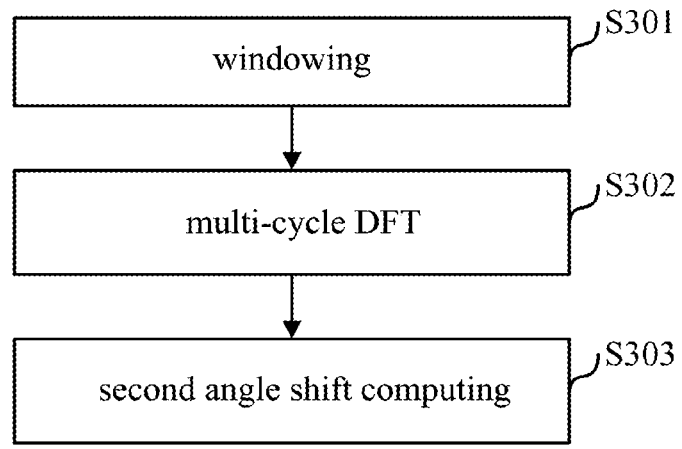
FIG. 6 is a flow chart of an angle shift computing step S30 based on multi-cycle DFT in the frequency measurement method according to an embodiment of the disclosure.

FIG. 6 is a flow chart of the angle shift computing step S30 based on the multi-cycle DFT in the frequency measurement method according to an embodiment of the disclosure.

The angle shift computing step S30 based on multi-cycle DFT includes a windowing step S301 of intercepting and outputting the voltage sampling values of multiple cycles through a window function; a multi-cycle DFT step S302 of performing DFT process on the inputted voltage sampling values of the multiple cycles, and computing and outputting a second voltage phase angle; a second angle shift computing step S303 of computing and outputting a second angle offset as the second angle shift, in accordance with the second voltage phase angle.

A hamming window function is preferably used as the window function described above, but it is not limited thereto. Other appropriate window functions can also be adopted.

The number of the multiple cycles described above is preferably from one to ten, but it is not limited thereto. Other appropriate number of cycles can also be adopted.

Figure 7:
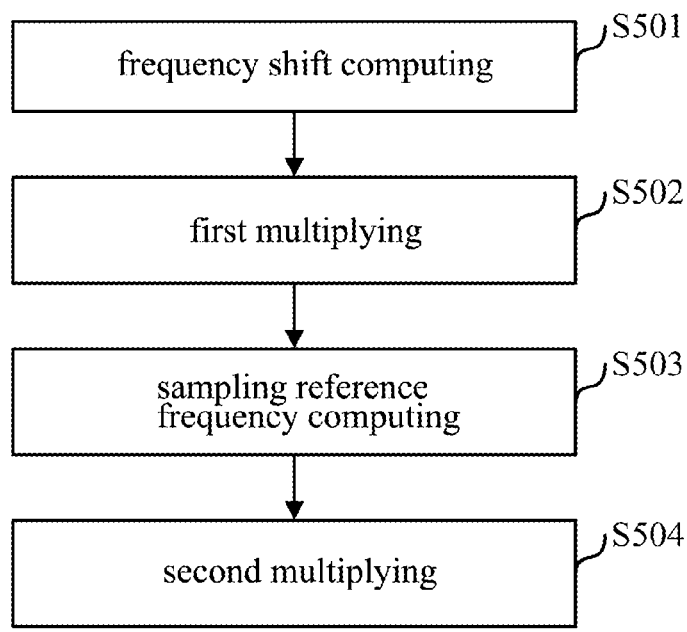
FIG. 7 is a flow chart of a sampling frequency computing and outputting step S50 in the frequency measurement method according to an embodiment of the disclosure.

FIG. 7 is a flow chart of the sampling frequency computing and outputting step S50 in the frequency measurement method according to an embodiment of the disclosure.

The sampling frequency computing and outputting step S50 includes a frequency shift computing step S501; a first multiplying step S502; a sampling reference frequency value computing step S503; and a second multiplying step S504.

In the frequency shift computing step S501, a frequency offset is computed and output in accordance with the selected angle offset inputted. In the first multiplying step S502, the frequency offset is multiplied by a first coefficient and a first result is output to the sampling reference frequency value computing step S503. In the sampling reference frequency value computing step S503, a sampling reference frequency value is computed and output in accordance with the inputted first result. In the second multiplying step S504, the sampling reference frequency value is multiplied by an integer, and a new sampling frequency is generated and output to a sampling module for adjusting the sampling frequency. The operation as described above is one iteration process, and after the sampling frequency is adjusted, a next iteration operation is waited to begin. Operation intervals can be set based on specific applications. For example, the iteration operation is performed once every 10 ms or 20 ms.

The first coefficient is adjustable and is of a value larger than 0 and less than 1, preferably larger than 0.1 and less than 1.

Figure 8:
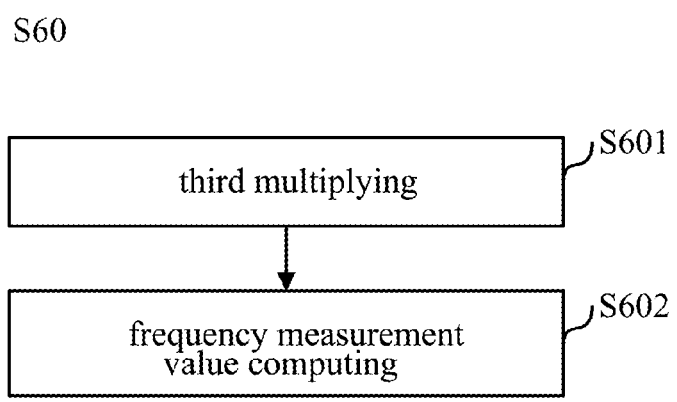
FIG. 8 is a flow chart of a frequency measurement value computing and outputting step S60 in the frequency measurement method according to an embodiment of the disclosure.

FIG. 8 is a flow chart of the frequency measurement value computing and outputting step S60 in the frequency measurement method according to an embodiment of the disclosure.

The frequency measurement value computing and outputting step S60 includes a third multiplying step S601 and a frequency measurement value computing step S602. In the third multiplying step S601, the frequency offset is multiplied by a second coefficient, and a second result is output to the frequency measurement value computing step S602. In the frequency measurement value computing step S602, the frequency measurement value is computed and output in accordance with the second result. The second coefficient is 1.

The frequency measurement method of the embodiment of the disclosure has a good accuracy and reliability in the frequency measurement while the response speed can satisfy application requirements.

The frequency measurement device and method of the embodiment of the disclosure can be applied to the under frequency load shedding device, and can also be applied to other devices which require accurate measurement of the frequency.

The connection and constitution relationships of respective units (functional modules, chips and so on) in respective embodiments of the disclosure will not limit the protection scope of the disclosure, these units can be combined into a single unit, or specific units thereof can also be divided into a plurality of units which have less function.

The block diagrams in the figures illustrate the architecture, functionality, and operation of possible implementations of the frequency measurement device according to various embodiments of the present disclosure. In this regard, each block in the block diagrams can represent a module which contains one or more executable instructions for implementing the specified logical function(s). In some alternative implementations, the functions noted in the blocks may also occur out of the order noted in the figures. For example, two blocks shown in succession may, in fact, be executed substantially concurrently, or the blocks may sometimes be executed in the reverse order, depending upon the functionality involved. It will also be noted that each block of the block diagrams can be implemented by special purpose hardware-based ASIC that perform the specified functions or actions, or combinations of special purpose hardware and computer instructions.

The descriptions of the various embodiments of the present disclosure have been presented above for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

INDUSTRIAL APPLICABILITY

The frequency measurement device, the frequency measurement method and the under frequency load shedding device of the disclosure has a good accuracy and reliability of the frequency measurement while the response speed can satisfy application requirements, which can reduce possibility of false operations of the under frequency load shedding device.

What is claimed is:
1. A frequency measurement device, comprising:
a sampling module unit that outputs a voltage sampling value in accordance with a voltage to be sampled and a sampling frequency input thereto;
an angle shift computation unit based on single-cycle Discrete Fourier Transform DFT that computes and outputs a first angle shift based on the single-cycle DFT, in accordance with the voltage sampling value input from the sampling module unit;
an angle shift computation unit based on multi-cycle DFT that computes and outputs a second angle shift based on the multi-cycle DFT, in accordance with the voltage sampling value input from the sampling module unit;
an angle shift selection unit that selects and outputs one of the first angle shift and second angle shift an absolute value of which is smaller as a selected angle offset, in accordance with the first angle shift and second angle shift input thereto;
a sampling frequency computation and outputting unit that computes a sampling frequency in accordance with the selected angle offset input thereto, and outputs the sampling frequency to the sampling module unit as a new sampling frequency; and
a frequency measurement value computation and outputting unit that computes and outputs a frequency measurement value in accordance with the selected angle offset input thereto.

2. The frequency measurement device according to claim 1, wherein
the angle shift computation unit based on the single-cycle DFT includes:
a single-cycle DFT unit that performs DFT process on a voltage sampling value of single-cycle input thereto and outputs a first voltage phase angle; and
a first angle shift computation unit that computes and outputs a first angle offset as the first angle shift, in accordance with the first voltage angle phase, and
the angle shift computation unit based on the multi-cycle DFT includes:
a window unit that intercepts and outputs the voltage sampling value of multiple cycles through a window function;
a multi-cycle DFT unit that performs DFT process on the voltage sampling value of the multiple cycles input thereto, and computes and outputs a second voltage phase angle; and
a second angle shift computation unit that computes and outputs a second angle offset as the second angle shift, in accordance with the second voltage angle phase.

3. The frequency measurement device according to claim 2, wherein
the window function is a hamming window function, and the number of the multiple cycles is from one to ten and can be adjusted depending on application requirements.

4. The frequency measurement device according to claim 1, wherein
the sampling frequency computation and outputting unit includes:
a frequency shift computation unit;
a first multiplier;
a sampling reference frequency value computation unit; and
a second multiplier,
the frequency shift computation unit computes and outputs a frequency offset in accordance with the selected angle offset input thereto, the first multiplier multiplies the frequency offset by a first coefficient and outputs a first result to the sampling reference frequency value computation unit, the sampling reference frequency value computation unit computes and outputs a sampling reference frequency value in accordance with the first result input thereto, the second multiplier multiplies the sampling reference frequency value by an integer, generates a new sampling frequency and outputs the new sampling frequency to the sampling module unit for adjusting the sampling frequency, and the frequency measurement value computation and outputting unit includes:
a third multiplier; and
a frequency measurement value computation unit,
the third multiplier multiplies the frequency offset by a second coefficient, and outputs a second result to the frequency measurement value computation unit, and the frequency measurement value computation unit computes and outputs the frequency measurement value in accordance with the second result.

5. The frequency measurement device according to claim 4, wherein
an iteration process which includes processes from the sampling module unit to the sampling frequency computation and outputting unit and process of outputting the new sampling frequency to the sampling module unit is performed every specified operation interval, and the operation interval is set by a specific application,
the first coefficient is of a value larger than 0 and less than 1, and the second coefficient is 1.

6. An under frequency load shedding device, comprising the frequency measurement device according to claim 1.

7. A frequency measurement method, comprising:
a sampling step of inputting a voltage to be sampled and a sampling frequency to a sampling module and outputting a voltage sampling value;
an angle shift computing step based on single-cycle Discrete Fourier Transform DFT of computing and outputting a first angle shift based on the single-cycle DFT, in accordance with the voltage sampling value input from the sampling step;
an angle shift computing step based on multi-cycle DFT of computing and outputting a second angle shift based on the multi-cycle DFT, in accordance with the voltage sampling value input from the sampling step;
an angle shift selecting step of selecting and outputting one of the first angle shift and the second angle shift an absolute value of which is smaller as a selected angle offset, in accordance with the first and second angle shifts;
a sampling frequency computing and outputting step of computing a sampling frequency in accordance with the selected angle offset inputted, and outputting the sampling frequency to the sampling module as a new sampling frequency; and
a frequency measurement value computing and outputting step of computing and outputting a frequency measurement value in accordance with the selected angle offset.

8. The frequency measurement method according to claim 7, wherein
the angle shift computing step based on single-cycle DFT step includes:
a single-cycle DFT step of performing DFT process on the input voltage sampling value of single-cycle and outputting a first voltage phase angle;
a first angle shift computing step of computing and outputting a first angle offset as the first angle shift, in accordance with the first voltage angle phase, and
the angle shift computing step based on multi-cycle DFT step includes:
a windowing step of intercepting and outputting the voltage sampling value of multiple cycles through a window function;

a multi-cycle DFT step of performing DFT process on the input voltage sampling values of the multiple cycles, and computing and outputting a second voltage phase angle;

a second angle shift computing step of computing and outputting a second angle offset as the second angle shift, in accordance with the second voltage phase angle.

9. The frequency measurement method according to claim 8, wherein the window function is a hamming window function, and the number of the multiple cycles is from one to ten and can be adjusted depending on application requirements.

10. The frequency measurement method according to claim 7, wherein the sampling frequency computing and outputting step includes:

a frequency shift computing step;

a first multiplying step;

a sampling reference frequency value computing step; and a second multiplying step, in the frequency shift computing step, a frequency offset is computed and output in accordance with the selected angle offset inputted, in the first multiplying step, the frequency offset is multiplied by a first coefficient and a first result is output to the sampling reference frequency value computing step, in the sampling reference frequency value computing step, a sampling reference frequency value is computed and output in accordance with the inputted first result, in the second multiplying step, the sampling reference frequency value is multiplied by an integer, and a new sampling frequency is generated and output to the sampling module for adjusting the sampling frequency, and the frequency measurement value computing and outputting step includes:

a third multiplying step; and a frequency measurement value computing step, in the third multiplying step, the frequency offset is multiplied by a second coefficient, and a second result is output to the frequency measurement value computing step, and in the frequency measurement value computing step, the frequency measurement value is computed and output in accordance with the second result.

11. The frequency measurement method according to claim 10, wherein the first coefficient is of a value larger than 0 and less than 1, and the second coefficient is 1.

12. The frequency measurement method according to claim 7, wherein an iteration process from the sampling step to the sampling frequency computing and outputting step is performed every specified operation interval, and the operation interval is set by a specific application.

* * * * *